United States Patent [19]

Brown et al.

[11] Patent Number: 4,560,435

[45] Date of Patent: Dec. 24, 1985

[54] COMPOSITE BACK-ETCH/LIFT-OFF STENCIL FOR PROXIMITY EFFECT MINIMIZATION

[75] Inventors: Karen H. Brown, Yorktown Heights, N.Y.; David F. Moore, Cambridge, England; Bernard J. C. van der Hoeven, Jr., Pound Ridge, N.Y.

[73] Assignee: International Business Machines Corporation, Armonk, N.Y.

[21] Appl. No.: 656,803

[22] Filed: Oct. 1, 1984

[51] Int. Cl.[4] .......................... C23F 1/02; B44C 1/22; C03C 15/00; C03C 25/06

[52] U.S. Cl. ...................................... 156/643; 29/591; 156/652; 156/656; 156/659.1; 156/661.1; 204/192 E; 357/5; 357/71; 427/89

[58] Field of Search ............... 156/643, 646, 652, 656, 156/659.1, 661.1, 904; 29/591; 204/192 EC, 192 E; 427/38, 39, 88–90; 430/313, 317, 318, 314; 357/65, 67, 68, 71, 5

[56] References Cited

U.S. PATENT DOCUMENTS

| | | | |
|---|---|---|---|
| 3,858,304 | 1/1975 | Leedy et al. | 29/578 |
| 3,907,620 | 9/1975 | Abraham et al. | 156/11 |
| 3,982,943 | 9/1976 | Feng et al. | 96/38.4 |
| 4,026,742 | 5/1977 | Fujino | 156/643 |
| 4,341,850 | 7/1982 | Coane | 430/11 |

OTHER PUBLICATIONS

R. F. Broom, "Niobium Tunnel Junction Fabrication," IBM Technical Disclosure Bulletin, vol. 20, No. 5, Oct. 1977, p. 1973.

P. Chaudhari, "Composite Metallurgy Devices," IBM Technical Disclosure Bulletin, vol. 23, No. 4, Sep. 1980, p. 1678.

S. M. Faris et al., "Josephson Logic Circuit Process Using Edge Junctions," IBM Tech. Discl. Bulletin, vol. 25, No. 9, Feb. 1983, pp. 4602–4606.

Primary Examiner—William A. Powell
Attorney, Agent, or Firm—Carl C. Kling

[57] ABSTRACT

This composite back-etch/lift-off stencil method avoids the uncontrolled changes in the properties of contacts in small devices caused by the close proximity of the lift-off resist stencil to the contact area during the precleaning, surface preparation and metal deposition processes. This method limits the area of the wafer exposed to back-etching and thus restores the freedom of choice of contact metallurgy. Back-etching is only applied in the areas of the wafer near to the contact holes; lift-off techniques are used for the rest of the integrated circuit.

2 Claims, 5 Drawing Figures

COMPOSITE BACK-ETCH/LIFT-OFF STENCIL FOR PROXIMITY EFFECT MINIMIZATION

BACKGROUND OF THE INVENTION

1. Field of the Invention

This invention relates to integrated circuit manufacturing processes, and more particularly relates to a composite stencil process for deposition of contacts to active devices, which composite stencil process is minimally susceptible to local geometry effects caused by the presence of lift-off stencil material proximate to active device areas.

2. Description of the Prior Art

The prior art of integrated circuit manufacture has passed from art to science in areas of purity of materials, miniaturization of circuit connectors and active devices so as to allow massive replication of circuits on a chip, and many other process improvements. As process improvements are made, demand absorbs these improvements as integration scale increases in number of devices per chip from 1 to 2, 4, 16, 64, 1024... toward very large scale integration of millions of devices per chip. As these changes occur, new problems arise. One change is that vertical dimensional control has become vital; even thin films at high scales of integration can shadow adjacent device areas during deposition, and cause degradation of device performance unacceptable in very large scale integration.

Integrated circuits normally require contact and conductor metallization for interconnection to active device areas, such as semiconductor electrodes or Josephson junction electrodes. As integrated circuits become more complex, the need for crossovers and layer interconnections have required the development of improved manufacturing techniques to free the designer from the tyrannical demands of vertical topography. The milder demands of horizontal topography are generally not addressed.

Horizontal topography is just beginning to be recognized as a design constraint; as integration reaches levels where deposition shadowing can affect device parameters, horizontal topography becomes a serious design constraint. Proximity effects, which may result from the mere physical presence of one masking material adjacent to an area where another material is to be deposited or grown, have become a major problem area in the production of Josephson junction devices. The actual edge of a thin film might be the locus of an active device, and the thickness of the photoresist might be so great that its shadow might adversely affect the properties of the device defined by an opening in the photoresist. Chemical and physical contamination by adjacent materials also are possible.

Quality control techniques for photoresist stencil definition have generally included great care in such things as control of purity, control of exposure, and control of removal of circuit material and stencil material by etching or related techniques. Lift-off techniques have been increasing in favor of removal of stencils after device preparation, because lift-off is significantly gentler than other material removal techniques.

Back-etching for metal removal is a technique which obviates the need to have resist adjacent the device area during cleaning, surface preparation and deposition processes. Back-etching, however, can damage underlying layers in the device because of the over-etching necessary to ensure that the material has been completely removed.

Lift-off stencils and back-etching stencils are known as separate, mutually exclusive techniques, but the prior art does not teach nor suggest the use of a composite back-etch/lift-off technique to achieve a mask opening which has minimal proximity effect to the defined device.

The prior art is typified by the following patents and publications:

U.S. Pat. No. 3,858,304, Leedy et al, "Process for Fabricating Small Geometry Semiconductor Devices," Jan. 7, 1975. Leedy et al shows the use of a resist pattern left temporarily in place to permit lift-off to make very narrow contact metallizations.

U.S. Pat. No. 3,907,620, Abraham et al, "A Process of Forming Metallization Structures on Semiconductor Devices," Sept. 23, 1975, shows the use of a tantalum nitride mask with sputter etching to produce very fine line patterns.

U.S. Pat. No. 3,982,943, Feng et al, "Lift-Off Method of Fabricating Thin Films and a Structure Utilizable as a Lift-Off Mask," Sept. 28, 1976. Feng et al shows a composite photoresist which permits the use of lift-off without sputter etching and results in undercut openings.

U.S. Pat. No. 4,026,742, Fujino, "Plasma Etching Process for Making a Microcircuit Device," May 31, 1977, Fujino shows a contact metallization patterning process using a metal halide treatment to potentiate plasma etching.

U.S. Pat. No. 4,341,850, Coane, "Mask Structure for Forming Semiconductor Devices, Comprising Electron-Sensitive Resist Patterns with Controlled Line Profiles," July 27, 1982. Coane shows a composite photoresist having a semiconductor sandwiched between two resist layers.

R. F. Broom, "Niobium Tunnel Junction Fabrication," IBM Technical Disclosure Bulletin, Vol. 20, No. 5, October 1977, p. 1973. Broom shows a double lift-off technique.

Faris et al, "Josephson Logic Circuit Process Using Edge Junctions, " IBM Technical Disclosure Bulletin, Vol. 25, No. 9, Feb. 1983, pp. 4602–4606. Faris et al shows a multiple resist technique for making Josephson junctions.

The prior art does not provide protection from the proximity effect; the prior art does not teach the use of a composite photoresist technique to minimize proximity effects.

SUMMARY OF THE INVENTION

In superconductor technology there is an uncontrolled enhancement of the Josephson tunnel current density caused by the presence of the resist stencil for the counterelectrode near the junction during barrier formation. A presently employed process results in an increase of 100% in the tunnel current when the resist stencil is 2 microns from an edge junction. The increase is uncontrollable because it changes with mask alignment error at the rate of 100% per micron. This is to be compared with a device tolerance on the order of 10%.

This invention eliminates the constraint of limiting the choice of contact metals to those which can be etched with sufficiently great selectivity against all the other materials in the device that some over-etching may be tolerated. Etch selectivity between contact metal and silicon monoxide, for example, is acceptable.

This invention limits the area of the wafer exposed to back-etching and thus restores the freedom of choice of contact metallurgy. Back-etching is only applied to the areas of the wafer near to the contact holes. The novel lithographic process combines lift-off and back-etch techniques in such a way as to avoid the overlay problem when two masking levels are used.

The invention is a composite back-etch/lift-off stencil process which gives the general advantages of lift-off where horizontal topography permits, while using back-etch techniques in critical areas of the same layer, where horizontal topography prohibits the use of a lift-off stencil.

It is the object of this invention to provide in an integrated circuit manufacturing process a composite deposition masking technique which is free from the tyranny of horizontal topography.

Patterning the metal contact layer by back-etching obviates the need to have resist near the contact area during the cleaning, surface preparation and deposition processes. Back-etching, however, can damage underlying layers in the device because of the over-etching required to ensure complete removal of the layer over the entire wafer. Such damage is made tolerable by limiting the area of back-etching to the areas of the wafer proximate to the contact holes, the very areas where proximity effects occur, and using lift-off techniques for other areas of the wafer. Appropriate resists are used, with both back-etch and lift-off used for different areas of the same layer.

A more particular object of the invention is to gain the general advantages of the lift-off technique while avoiding the uncontrolled changes in the properties of contacts in small devices, which changes would otherwise occur as a function of the close proximity of the lift-off stencil to the contact area during precleaning, surface preparation and metal deposition processes.

A feature of the composite back-etch/lift-off stencil is that it eliminates the presence of lift-off materials at critical areas while retaining the overall advantages of the lift-off technique.

An advantage of the composite back-etch/lift-off stencil is that it allows tighter ground rules than are available with lift-off alone, thus improving circuit density.

Another advantage of the composite back-etch/lift-off stencil is its inherent self-alignment, since the back-etch stencil factor is left in place on the wafer when the lift-off stencil factor is deposited.

Another advantage of the composite back-etch/lift-off stencil is that it increases yield at the relatively minor cost of a separate resist/etch step and the complication of having some resist on the wafer during processing. Tradeoff of these minor complications for increased integrated circuit yield is highly advantageous.

The foregoing and other objects, features and advantages of the invention will be apparent from the more particular description of the preferred embodiments of the invention, as illustrated in the accompanying drawings.

DESCRIPTION OF A PREFERRED EMBODIMENT OF THE INVENTION

FIGS. 1-5 indicate the process steps in the preferred embodiment, a process for patterning contact metallization for an integrated circuit of Josephson junction technology. Josephson junctions typify integrated circuit technologies which are susceptible to proximity effects.

Figure 1:
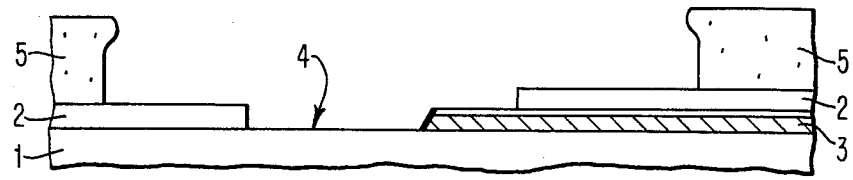
FIGS. 1-5 are identical partial cross-sectional views of an integrated circuit wafer and its overlying films during a sequence of composite back-etch/lift-off stencil process steps according to the invention.

Process steps known in the art result in the patterning and layering of the integrated circuit process intermediate shown in FIG. 1, after deposition of base electrode metal, preparation of a base electrode protective layer and Josephson junction, application of a photoresist layer, patterning exposure and removal of excess photoresist.

FIG. 1 is a cross-section of an integrated circuit wafer 1 during the Josephson junction fabrication process. Wafer 1 may be any suitable substrate, such as semiconductor grade silicon, which forms a smooth strong electrically passive platform for the layers making up the integrated circuit. The wafer may include surface passivation and groundplane layers, omitted here for clarity in presenting the invention. One or more Josephson junctions will be formed on the underlying metal base electrode layer 3 of niobium (Nb), by cleaning and oxidation in a rf plasma. Insulating layer 2, of silicon monoxide together with any intrinsic oxide layer which might form naturally on the niobium base electrode 3, protects the base electrode. A window 4 in the insulating layer 2 silicon monoxide (SiO) defines the junction, which requires controlled oxidation to form the junction and requires a counterelectrode over the junction to complete a Josephson junction device. Window 4 includes the final contact dimensions and also includes additional opening area of extension dimensions in the critical areas with respect to proximity effects. Stencil 5, for the lift-off resist stencil factor of the composite stencil, defines the desired intermediate pattern in the counterelectrode. Stencil 5 may be any common lift-off photoresist; e.g., stencil 5 may be AZ 1450 J modified for lift-off by inclusion of chlorobenzene or equivalent as is known in the art.

Figure 2:
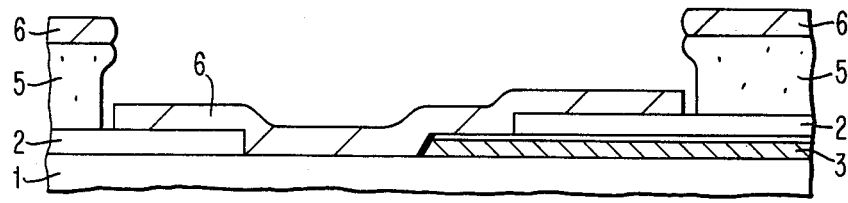

FIG. 2 is a cross-section of the wafer after evaporation of the intermediate pattern of the junction counterelectrode metal 6 (a lead indium gold alloy PbInAu). The lift-off resist stencil factor 5 may have an undercut (lift-off profile) as in FIGS. 2-4, in which case excess PbInAu alloy can be lifted off in resist solvent. Alternatively, a tapered resist profile may be used in which case the transition region must later be etched to ensure "lift-off." The former approach is simpler, but experimental results indicate that there is a tendency in the case of soft materials for evaporated material to remain under the undercut at the end of the process. The latter approach obviates this potential problem at the cost of slightly increased design complexity. The second resist layer, which when patterned becomes the back-etch resist stencil factor of the composite stencil, is applied by any known technique and patterned by removal, to present the appearance shown in FIG. 3.

Figure 3:
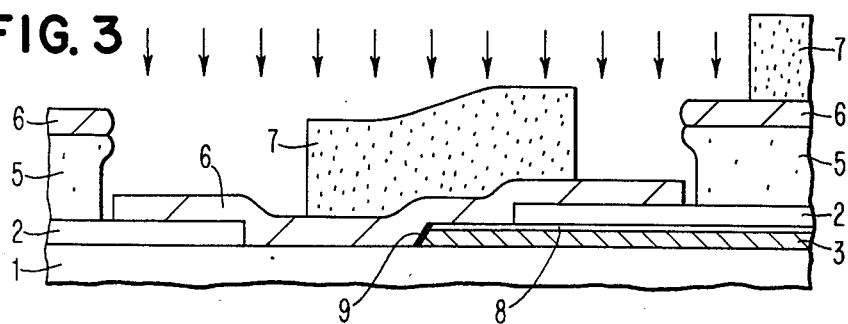

FIG. 3 is a cross-section of the wafer during back-etching of the unwanted counterelectrode material. The back-etch may be plasma etch using techniques known in the art. A second resist, the back-etch resist stencil factor or stencil 7, is put in place on wafer 1 to protect the critical areas of the integrated circuit on wafer 1 from the harsh realities of the back-etching process. (In the embodiment shown, a portion of contact 6, overlying niobium base electrode 3 and extending over a small distance of niobium base electrode protected only by oxide layer 8 on the niobium base electrode, completes the Josephson junction device 9 by forming the counterelectrode and by making electrical connection to other devices.) The shape of the resist 7 profile is not critical. A suitable resist is AZ 1450 J. The back-etch is by ion beam etching with argon, or with argon and oxygen. Alternative back-etch techniques include RF sputter etching and reactive etching with gases or liquids, as well as various ion milling techniques, which are known to the art.

Figure 4:
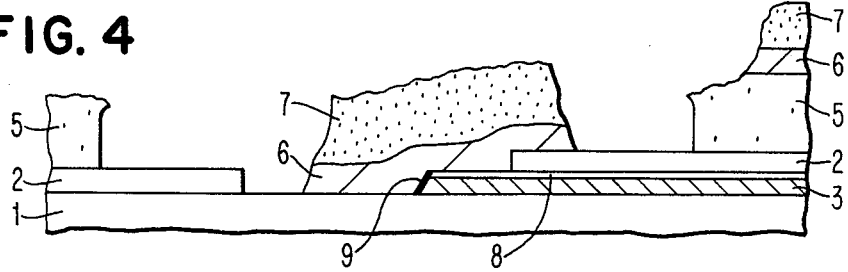

FIG. 4 is a cross-section of wafer 1 after the back-etch process has been completed. The counterelectrode material has been completely removed from those areas of the wafer which were free of resist. The resists themselves have been subjected to the plasma etching, and consequently have been partially removed, but sufficient thickness of the resists remain to protect the underlying materials. Where both the lift-off resist stencil factor and the back-etch resist stencil factor of the composite stencil were in place (resist layers 5 and 7, respectively) the underlying contact metal alloy layer 6 still remains on top of the lift-off resist stencil factor mask. This does no harm and is subsequently stripped off with the lift-off resist stencil factor.

Figure 5:
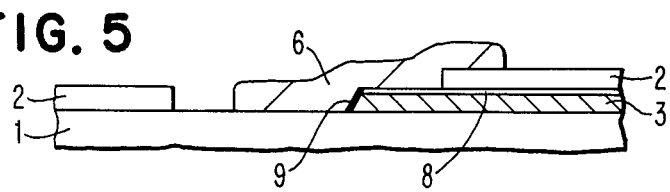

FIG. 5 is a cross-section of the wafer after stripping both resist masks 5 and 7 (lift-off stencil factor and back-etch stencil factor) in solvent. The process has removed all the excess contact metal alloy which was on the resist mask. The only remaining contact metal alloy 6 is the desired pattern overlying the Josephson junction 9.

Advantages of this invention, keyed to the description of the preferred embodiment, are:

1. Importance for VLSI: circuit density is improved by allowing tighter ground rules than would be possible with lift-off patterning alone.

2. Manufacturability: no special alignment of the lift-off and back-etch masks is required. The trick of leaving the first stencil on the wafer when the second stencil is applied avoids alignment problems.

3. Low risk: minimum exposure of the circuit elements on the wafer to damage from over-etching during the back-etch process.

4. General applicability: the fraction of the wafer covered by the second resist stencil can be optimized to suit the back-etch process. For example, the area of metal exposed could be minimized to reduce loading effects in the etch process. Alternatively, the area of metal could be maximized to reduce the loading effects due to resist. In the Josephson case, patterning the PbInAu counterelectrode by back-etching obviates the need to have resist near the junction during barrier formation. Over-etching would likely damage the underlying insulating layers in the device. The composite lift-off and back-etch stencil limits the over-etch so that it occurs only in the areas of the wafer near the Josephson junctions, and the uncontrolled enhancement of the tunnel current density due to the proximity of the resist stencil is avoided.

Thus, while the composite back-etch/lift-off stencil of the invention has been described to obviate proximity effect problems in a process application for making Josephson junction integrated circuits, it is understood that those skilled in the art will make appropriate changes in form and details of other integrated circuit applications, without departing from the scope of the invention.

Having thus described our invention, what we claim as new, and desire to secure by Letters Patent is:

1. A method for making integrated circuits having critical wafer areas which are susceptible to proximity effect degradation at critical areas —characterized by—
   (a) patterning a lift-off resist stencil factor with windows including contact dimensions and extension dimensions extending beyond the contact dimensions in the critical areas with respect to proximity effects;
   (b) depositing contact metal using the windows as a pattern, covering both contact dimensions and extension dimensions;
   (c) patterning a back-etch resist stencil factor over selected portions of said contact metal, providing protection to the underlying layers within the contact dimensions but exposing contact metal within the extension dimensions;
   (d) back etching to the selected pattern of metallization by removing contact metal from the extension dimensions; and
   (e) removing said lift-off resist stencil factor and said back-etch resist stencil factor.

2. A method for making integrated circuits having critical wafer areas with respect to proximity effects, which areas require protection from process-related degradation —characterized by —
   (a) patterning a lift-off resist stencil factor over the wafer omitting the critical areas with respect to proximity effects;
   (b) patterning a combination contact metal stencil factor generally coextensive to the critical areas, using the lift-off resist stencil factor as a pattern, providing coverage with contact metal material in the critical areas not only where desired as a contact metallization, but with excess coverage extending to the boundary of said lift-off resist stencil factor, whereby a composite contact metal/lift-off stencil is completed;
   (c) patterning a back-etch resist stencil over selected portions of said contact metal stencil factor extending less than the entire distance to said lift-off resist stencil factor, to define a desired metal contact configuration;
   (d) back-etching said contact metal stencil factor to the selected configuration of contact metal; and
   (e) removing the lift-off resist stencil factor;
whereby the contact metal remains in the selected configuration and the critical area remains free of lift-off stencil factor and any resulting proximity effects.

* * * * *